US006637677B1

(12) United States Patent
Ruehle et al.

(10) Patent No.: US 6,637,677 B1
(45) Date of Patent: Oct. 28, 2003

(54) FUEL INJECTOR

(75) Inventors: Wolfgang Ruehle, Ditzingen (DE); Hubert Stier, Asperg (DE); Matthias Boee, Ludwigsburg (DE); Guenther Hohl, Stuttgart (DE); Norbert Keim, Loechgau (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/580,867

(22) Filed: May 30, 2000

(30) Foreign Application Priority Data

Jun. 1, 1999 (DE) ........................................ 199 25 102

(51) Int. Cl.[7] ............................ B05B 1/30; H01L 41/04

(52) U.S. Cl. ....................... 239/584; 123/498; 123/478; 310/328

(58) Field of Search ................................ 123/498, 472, 123/506, 458, 478; 239/88, 89, 90, 91–96, 584, 585.1–585.5; 310/316.01–316.03, 317, 318, 327, 328, 367

(56) References Cited

U.S. PATENT DOCUMENTS 4,579,283 A * 4/1986 Igashira et al. ............... 239/88
4,608,958 A * 9/1986 Sakakibara et al. ......... 123/605
4,767,959 A * 8/1988 Sakakibara et al. ......... 310/317
4,803,393 A * 2/1989 Takahashi .................... 310/328
4,838,233 A * 6/1989 Hayashi et al. ............. 123/506
4,907,748 A * 3/1990 Gardner et al. ............. 239/584
5,803,361 A * 9/1998 Horiuchi et al. .............. 239/88
6,062,533 A * 5/2000 Kappel et al. ................ 251/57
6,119,952 A * 9/2000 Kappel et al. ................. 239/5

FOREIGN PATENT DOCUMENTS

DE 195 34 445 3/1997
DE 42 32 225 11/1997

* cited by examiner

*Primary Examiner*—Carl S. Miller
(74) *Attorney, Agent, or Firm*—Kenyon & Kenyon

(57) ABSTRACT

A fuel injector, particularly an injector of an internal combustion engine, has a piezoelectric or magnetostrictive actuator which is arranged in an actuator chamber which is sealed against the fuel, the fuel injector having a valve-closure member which can be actuated by the actuator via a valve needle, and which cooperates with a valve-seat face to form a sealing seat. In this context, the seal for forming the permeation-resistant sealing contains at least two elastomer sealing devices arranged in tandem.

6 Claims, 1 Drawing Sheet

FUEL INJECTOR

BACKGROUND INFORMATION

German Patent No. 195 34 445 describes a fuel injector which has an actuator arranged in an actuator chamber and a valve-closure member which can be actuated by the actuator via a valve needle, the valve-closure member cooperating with a valve-seat face to form a sealing seat. The valve needle is joined positively to a pressure shoulder via which the actuator acts upon the valve needle against the force of a compression spring. In this context, the pressure shoulder and the valve needle are guided in a valve housing. To direct the fuel in the direction of the sealing seat, the pressure shoulder and the valve needle each have one central bore. To seal the actuator against the fuel, the guideway between the pressure shoulder and the valve body or between the valve needle and the valve body has a sealing design. Since the valve needle and the pressure shoulder, respectively, must be able to move in the valve body, the actuator is not completely sealed against the fuel but only against the fuel pressure.

The fuel injector described in German Patent No. 195 34 445 has the disadvantage that the actuator continues to be subjected to the chemical action of the fuel, and that the mobility of the valve needle is deteriorated by the seal. Besides, the service life of the fuel injector is reduced by the arising friction.

German Patent No. 42 32 225 describes a device, where a piezoelectric actuator is sealed against a pressurizing medium. In this context, the seal is effected via an elastic sealing element. In this connection, the pressurizing medium is used for transferring the lift, and is therefore not charged with a high pressure. However, the seal described in German Patent No. 42 32 225 is not suitable for fuels, particularly not for fuel under very high pressure. In the case of fuel under very high pressure, the problem arises that the connection between the sealing element and a body (housing) does not withstand the high fuel pressure. Besides, fuel has a high permeation so that the sealing elements are penetrated by the fuel, as a result of which fuel or fuel-vapor gets through the seal. This applies particularly to gasoline fuel.

SUMMARY OF THE INVENTION

The fuel injector according to the present invention has the advantage that a permeation-resistant sealing of the actuator is achieved. In this manner, the actuator is protected both from the pressure of the fuel and from the chemical action of the fuel.

Advantageously formed between the two elastomer seals is a space which is vented by a vent duct. In this manner, fuel gas penetrating through the first elastomer seal is led out of the space so that the sealing of the actuator against the fuel is further improved.

The fuel injector expediently has an axially movable actuator housing having a pot-shaped design, the housing at least partially surrounding the actuator, and being surrounded at least sectionally by the elastomer seals. Thus, a lift of the actuator is made possible in a simple manner.

During a lift of the actuator, the elastomer seals are elastically deformed without sliding motion so that no friction losses result, which improves the long-term stability of the fuel injector.

DETAILED DESCRIPTION

Figure 1:
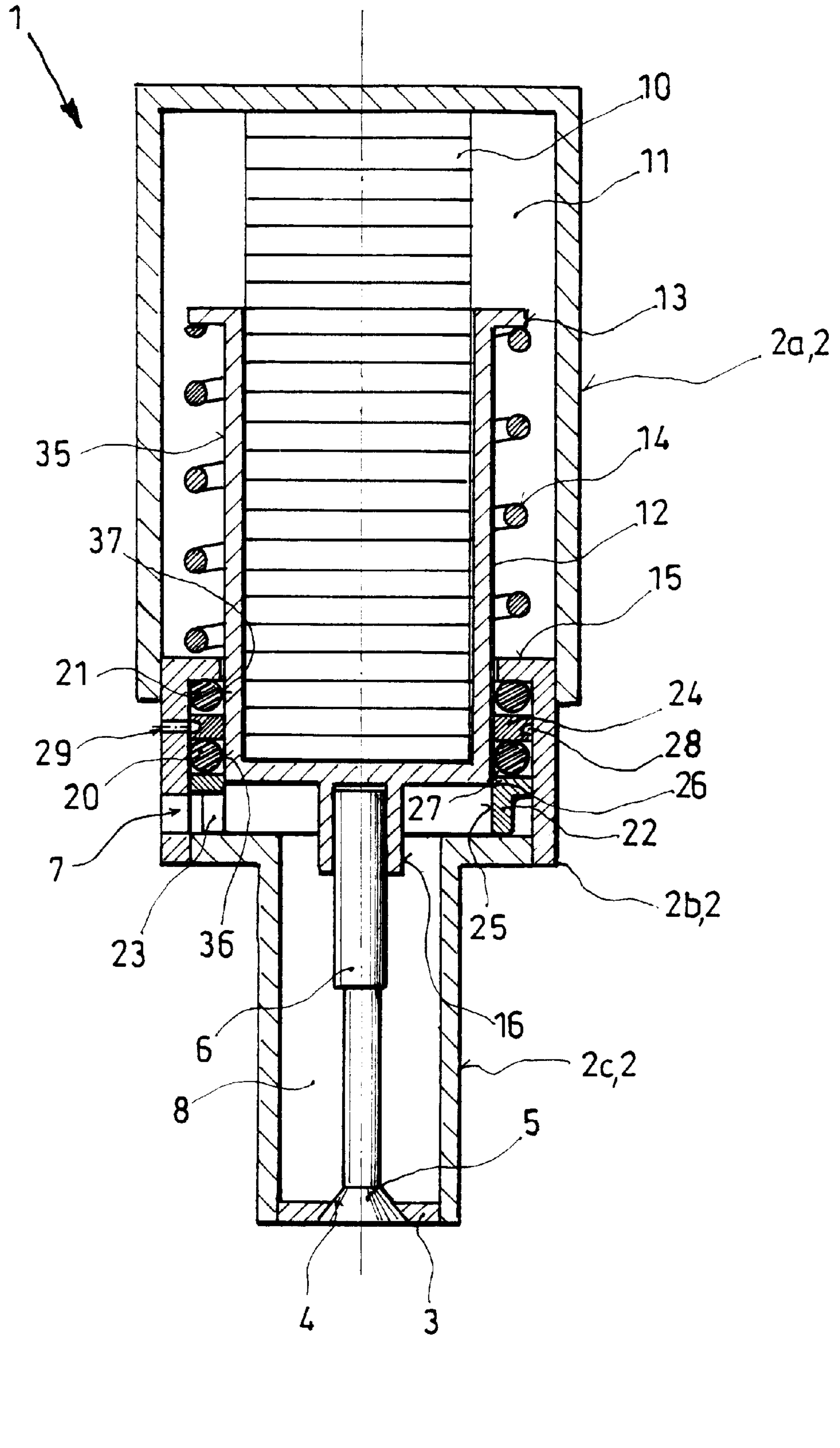
FIG. 1 shows an axial section through an exemplary embodiment of a fuel injector according to the present invention.

FIG. 1 shows a sectional axial view, in part, of a fuel injector 1 according to the present invention. Fuel injector 1, as a "gasoline direct injector", is used particularly for directly injecting fuel, in particular gasoline, into the combustion chamber of a mixture-compressing internal combustion engine with externally supplied ignition. However, fuel injector 1 according to the present invention is also suitable for other application cases.

Fuel injector 1 has a valve body 2 which, in the exemplary embodiment, is depicted in a simplified manner and is composed of component parts 2*a*–2*c*. Fastened to part 2*c* of valve body 2 is a valve-seat body 3 having a valve-seat face 4 which cooperates with a valve-closure member 5 to form a sealing seat. Valve-closure member 5 has a frustoconical design widening in the spray direction. Valve-closure member 5 is actuated by a valve needle 6, which, in the exemplary embodiment shown, is formed in one piece with valve-closure member 5. Fuel is supplied into a fuel chamber 8 formed in the interior of valve body 2 via a fuel inlet connection 7, which is depicted in a simplified manner, and which is provided, for example, laterally in the form of an opening in the middle part 2*b* of valve body 2.

Fuel injector 1 is actuated by a, for example, piezoelectric or magnetostrictive actor 10 which is located in an actuator chamber 11 formed in the interior of fuel injector 1. Fuel injector 1 has an axially movable actuator housing 12 having a pot-shaped design, the housing at least partially surrounding the actuator 10. Actuator housing 12 has a collar 13 which a compression spring 14 is braced against with its one end whereby actuator 10 is preloaded. In this context, compression spring 14, with its other end, is braced against a collar 15 formed on valve body 2 of fuel injector 1. Actuator housing 12 has a tubular section 16 which is joined positively to valve needle 6. In response to the actuation of actuator 10, the actuator expands, acting upon valve needle 6 via actuator housing 12, as a result of which valve-closure member 5 raises from valve-seat face 4, and the sealing seat is opened. Because of the resulting gap between valve-closure member 5 and valve-seat face 4, fuel issues from fuel chamber 8 of fuel injector 1 into the combustion chamber of an internal combustion engine.

For injecting fuel into the combustion chamber of the internal combustion engine, high fuel pressures on the order of 100 bar are needed. To protect actuator 10 from the influence of the fuel pressure and the chemical action of the fuel, provision is made for a seal containing a first elastomer sealing device 20 and a second elastomer sealing device 21. In this context, first elastomer seal 20 supports itself against valve body 2 via a first supporting element 22 during the opening motion. To allow the fuel to pass from fuel inlet connection 7 into fuel chamber 8, first supporting element 22 has an opening 23. Between the two elastomer seals 20 and 21, a second supporting element 24 is provided, as a result of which a fixed distance between elastomer seals 20, 21 is given. In response to an actuation of actuator 10, actuator housing 12 is guided at an inner surface 25 of first supporting element 22.

The highly pressurized fuel in fuel chamber 8 penetrates into a space 27 via a separating line 26 formed between first supporting element 22 and actuator housing 12. Because of first elastomer seal 20 arranged between valve body 2 and actuator housing 12, the fuel cannot flow any further in the direction of actuator chamber 11. However, due to the high pressure of the fuel, a permeation takes place, i.e., fuel gas penetrates through first elastomer seal 20, so that the space between the two elastomer seals 20, 21 fills with fuel gas. The fuel gas accumulates in a space 28 given by a recess at supporting element 24. To allow the fuel gas to escape from space 28, valve body 2 has a vent duct 29, which can lead to an appropriate collecting tank or filter. Second elastomer seal 21 seals actuator chamber 11 against the fuel gas so that the fuel gas cannot reach actuator 10.

Elastomer seals 20, 21, together with a lateral surface 35 of actuator housing 12, form a first sealing surface 36 and a second sealing surface 37. In this context, the distance of the two sealing surfaces 36, 37 is given by second supporting element 24. In response to the actuation of actuator 10, actuator housing 12 is moved in the axial direction, during which elastomer seals 20, 21 deform elastically. When working with a usual lift of valve needle 6 on the order of 100 $\mu$m, the elastic deformation of elastomer seals 20, 21 is sufficient to follow the movement of actuator housing 12 so that elastomer seals 20, 21 do not slide over lateral surface 35.

In the depicted exemplary embodiment, actuator chamber 11 is sealed against the fuel in fuel chamber 8 by two elastomer seals 20, 21 which sectionally surround actuator housing 12. However, provision can also be made for three or more elastomer seals. Moreover, elastomer seals 20, 21 can be joined positively to valve body 2 or to actuator pot 12.

The present invention is not limited to the described exemplary embodiment. In particular, the present invention is also suitable for an internally opening fuel injector 1.

What is claimed is:

1. A fuel injector for an injection system of an internal combustion system, comprising:

a valve needle;

a valve-seat face;

a valve-closure member cooperating with the valve-seat face to form a sealing seat;

an actuator chamber;

an actuator for actuating the valve-closure member via the valve needle, the actuator being situated in the actuator chamber, the actuator being one of a piezoelectric actuator and a magnetostrictive actuator;

a seal for forming a permeation-resistant sealing between the actuator chamber and fuel, the seal including at least two elastomer sealing devices arranged in tandem;

a first supporting element, a first of the at least two elastomer sealing devices supporting itself against the first supporting element;

a valve body, the first supporting element supporting itself against the valve body; and an actuator housing having a pot-shaped design and being axially movable with respect to the valve body, the actuator housing at least partially surrounding the actuator, the actuator housing being circularly surrounded at least sectionally by the at least two elastomer sealing devices.

2. The fuel injector according to claim 1, wherein the at least two elastomer sealing devices are situated between a lateral surface of the actuator housing and the valve body.

3. The fuel injector according to claim 2, wherein the at least two elastomer sealing devices are elastically deformed with respect to the valve body without sliding motion during a motion of the actuator housing.

4. The fuel injector according to claim 1, wherein the actuator acts upon the valve needle via the actuator housing.

5. A fuel injector for an injection system of an internal combustion engine, comprising:

a valve needle;

a valve-seat face;

a valve-closure member cooperating with the valve seat face to form a sealing seat, the valve needle and the valve seat directly controlling a flow of fuel out of the injector;

an actuator chamber;

an actuator for actuating the valve-closure member via the valve needle, the actuator being situated in the actuator chamber, the actuator being one of a piezoelectric actuator and a magnetostrictive actuator;

a seal for forming a permeation-resistant sealing between the actuator chamber and fuel, the seal including at least two elastomer sealing devices arranged in tandem;

a first supporting element, a first of the at least two elastomer sealing devices supporting itself against the first supporting element; and a second supporting element situated between the first elastomer sealing device and a second of the at least two elastomer sealing devices.

6. A fuel injector for an injection system of an internal combustion engine, comprising:

a valve needle;

a valve-seat face;

a valve-closure member cooperating with the valve-seat face to form a sealing seat, the valve needle and the valve seat directly controlling a flow of fuel out of the injector;

an actuator chamber;

an actuator for actuating the valve-closure member via the valve needle, the actuator being situated in the actuator chamber, the actuator being one of a piezoelectric actuator and a magnetostrictive actuator;

a seal for forming a permeation-resistant sealing between the actuator chamber and fuel, the seal including at least two elastomer sealing devices arranged in tandem;

a first supporting element, a first of the at least two elastomer sealing devices supporting itself against the first supporting element; and a valve body, the first supporting element supporting itself against the valve body.

* * * * *